US012572329B1

(12) United States Patent
Margalit et al.

(10) Patent No.: US 12,572,329 B1
(45) Date of Patent: Mar. 10, 2026

(54) DIGITAL HARDWARE CIRCUIT FOR EFFICIENT REDUCTION OPERATIONS USING PARALLEL MATRIX COMPARISON

(71) Applicant: Next Silicon Ltd, Givatayim (IL)

(72) Inventors: Oded Margalit, Ramat Gan (IL); Ilan Tayari, Tzur Hadassa (IL)

(73) Assignee: Next Silicon Ltd, Givatayim (IL)

( * ) Notice: Subject to any disclaimer, the term of this patent is extended or adjusted under 35 U.S.C. 154(b) by 0 days.

(21) Appl. No.: 19/269,109

(22) Filed: Jul. 15, 2025

(51) Int. Cl.
    *G06F 7/02*    (2006.01)
    *G06F 5/01*    (2006.01)
    *H03K 19/20*    (2006.01)

(52) U.S. Cl.
    CPC ............... *G06F 7/02* (2013.01); *G06F 5/012* (2013.01); *H03K 19/20* (2013.01)

(58) Field of Classification Search
    CPC ............ G06F 7/02; G06F 5/012; H03K 19/20
    See application file for complete search history.

(56) References Cited

U.S. PATENT DOCUMENTS

| | | | |
|---|---|---|---|
| 2013/0321289 A1* | 12/2013 | Dubery ................... | G06F 3/044 |
| | | | 345/173 |
| 2019/0121839 A1* | 4/2019 | Mohajer ................... | G06F 7/58 |
| 2019/0303749 A1* | 10/2019 | Appuswamy ............. | G06F 7/53 |
| 2023/0153374 A1* | 5/2023 | Podlozhnyuk ....... | G06V 10/955 |
| | | | 708/520 |

* cited by examiner

*Primary Examiner* — Michael D. Yaary

(57) ABSTRACT

A digital hardware circuit and method for performing reduction operations that achieves constant timing depth regardless of input count. The invention replaces conventional sequential binary tree approaches with a parallel matrix comparison architecture where multiple comparator circuits simultaneously compare input signals against each other. Combinatorial logic circuits process comparison outputs to generate dominance signals indicating which input satisfies the reduction criteria, and selection logic outputs the final result. The parallel approach maintains exactly three logic levels regardless of number of processing inputs, enabling significantly higher clock frequencies than conventional methods whose timing depth increases logarithmically with input count. Applications include matrix multiplication engines, floating-point arithmetic units, and artificial intelligence accelerators where reduction operations for maximum/minimum finding, normalization, and other computations are performed millions of times per second. The constant timing depth enables operation at frequencies exceeding 1 GHz while providing scalable performance.

18 Claims, 4 Drawing Sheets

DIGITAL HARDWARE CIRCUIT FOR EFFICIENT REDUCTION OPERATIONS USING PARALLEL MATRIX COMPARISON

FIELD AND BACKGROUND OF THE INVENTION

The present invention relates generally to digital hardware circuits for performing reduction operations, and more to methods and systems for efficiently finding reduction operation values such as maximum or minimum values among multiple numerical inputs in high-speed digital processing applications.

In modern digital signal processing and computational systems, reduction operations—such as finding the maximum, minimum, sum, or product of multiple numerical values—are fundamental operations that occur millions of times per second. These operations are critical in floating-point arithmetic units, matrix multiplication engines, and artificial intelligence accelerators where performance bottlenecks can impact overall system throughput.

Floating-point arithmetic operations, such as addition and multiplication, typically require normalization processes that involve finding the maximum exponent among multiple operands. In matrix multiplication engines, for example those used in artificial intelligence and machine learning applications, reduction operations are performed extensively during accumulation and normalization phases. As these systems scale to handle larger datasets and operate at higher frequencies, the efficiency of reduction operations becomes increasingly important.

Traditional approaches to implementing reduction operations in digital hardware have relied primarily on binary tree comparison methods. In a conventional binary tree implementation for finding the maximum of $N=2^n$ elements, a balanced binary tree structure is constructed with $2^n$ leaves, where each internal node computes the maximum of its two children, and the root node produces the maximum of all input values. This approach is mathematically optimal in terms of the number of comparisons required, using exactly $2^{n-1}$ comparisons, and achieves a theoretical minimum depth of n logic levels. Furthermore, modern hardware synthesis tools, while sophisticated in their optimization capabilities, are constrained by the fundamental sequential nature of binary tree comparisons. Even with advanced optimization techniques, the inherent depth of the comparison tree limits the ability of synthesis tools to achieve optimal timing closure at high frequencies.

SUMMARY OF THE INVENTION

The present invention provides a digital hardware circuit and method that achieves almost constant timing depth for reduction operations regardless of input count. Unlike conventional binary tree approaches that require $\log_2(N)$ sequential logic levels, the invention employs a parallel matrix comparison architecture where comparator circuits simultaneously compare every input against every other input. Combinatorial logic circuits process comparison outputs to generate dominance signals, and selection logic identifies the final result. This parallel approach maintains exactly three logic levels whether processing 4, 8, 16, or more inputs, enabling significantly higher clock frequencies than conventional methods. The invention is particularly valuable for matrix multiplication engines, floating-point arithmetic units, and AI accelerators where reduction operations are performed millions of times per second at frequencies exceeding 1 GHz.

Unless otherwise defined, all technical and/or scientific terms used herein have the same meaning as commonly understood by one of ordinary skills in the art to which the invention pertains. Although methods and materials similar or equivalent to those described herein may be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE SEVERAL VIEWS OF THE DRAWING(S)

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIG. 1 is a schematic block diagram illustrating a digital hardware circuit for finding a reduction operation value among a plurality of input signals, showing the parallel matrix comparison architecture with input registers, comparator circuits, combinational logic circuits, and selection logic arranged to achieve constant timing depth operation, according to some embodiments of the present invention;

Figure 3:
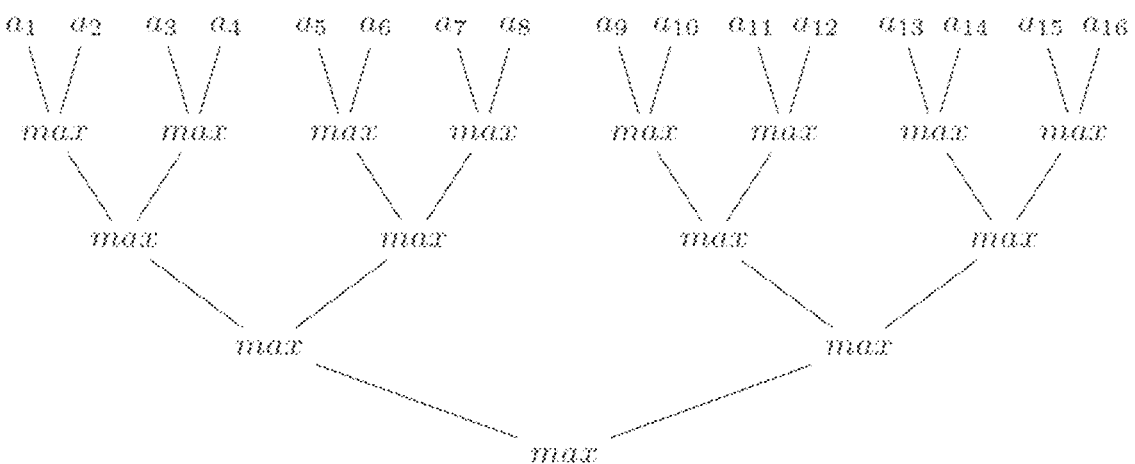
FIG. 3 is a schematic block diagram illustrating a traditional binary tree comparison method of the prior art for determining a maximum value among multiple input signals, showing the sequential logic levels that create timing bottlenecks.
Figure 4:
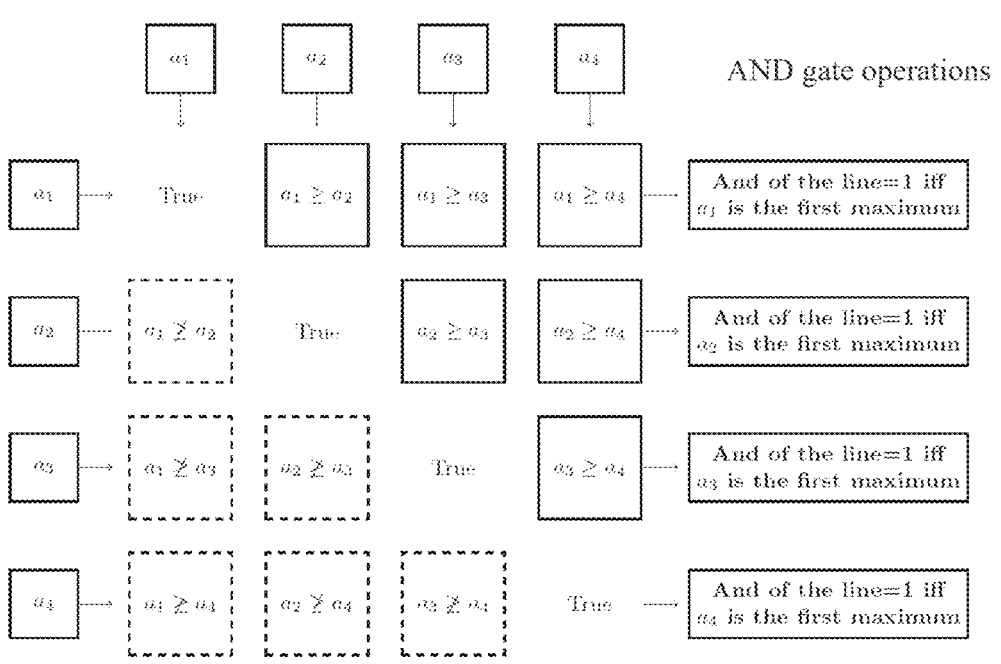
Figure 5:
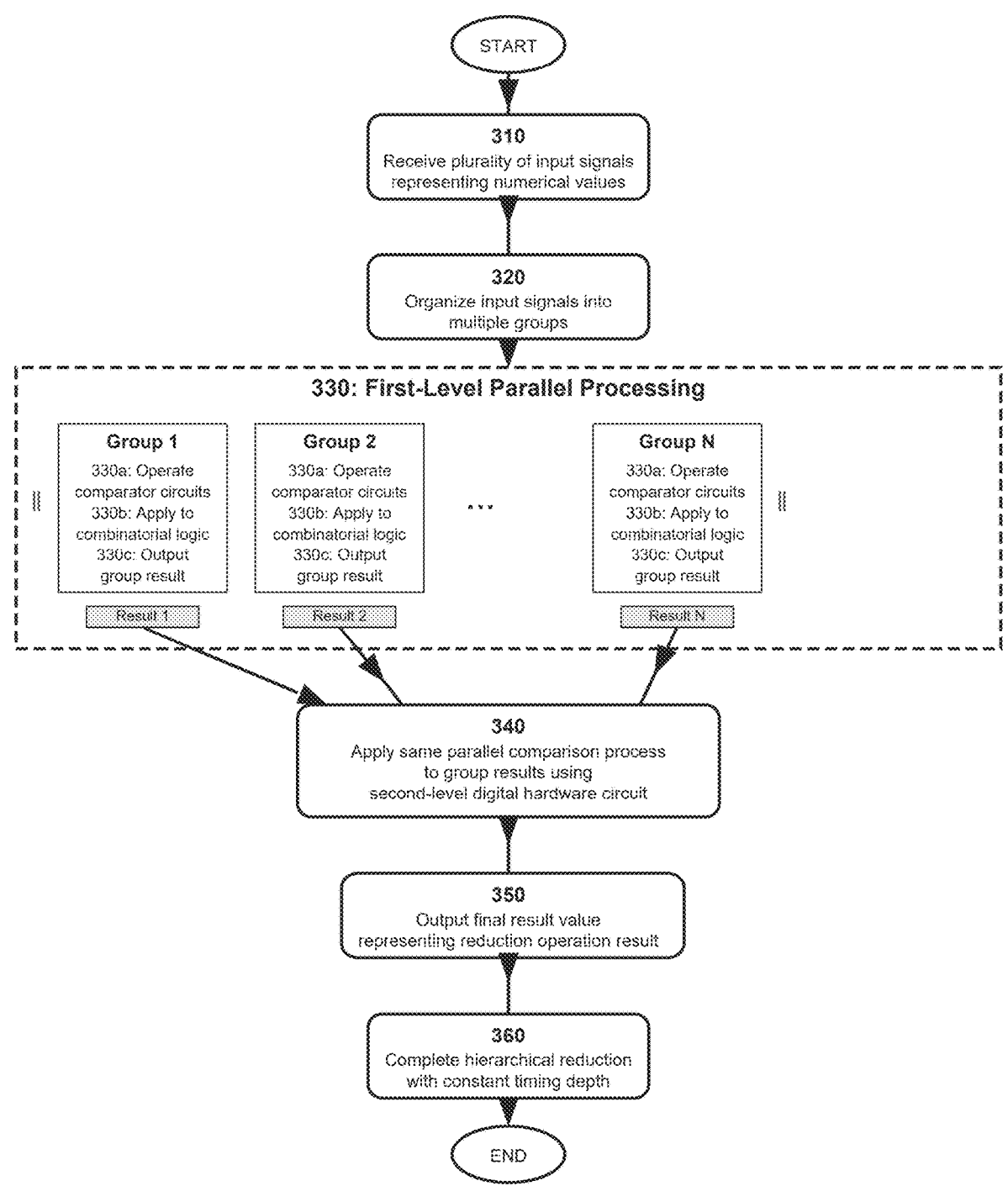

FIG. 4 is a schematic block diagram illustrating the parallel matrix comparison method of the present invention, contrasting with the prior art approach of FIG. 3 and demonstrating the simultaneous comparison operations and constant timing depth advantages; and FIG. 5 is a flowchart illustrating a hierarchical method of operating digital hardware circuits for processing larger numbers of input signals, showing how multiple parallel comparison processes can be combined to maintain constant timing depth while scaling to larger input counts, according to some embodiments of the present invention.

DESCRIPTION OF SPECIFIC EMBODIMENTS OF THE INVENTION

The present invention will be described with reference to the accompanying drawings, wherein like reference numerals refer to like elements throughout.

The present invention relates generally to digital hardware circuits for performing reduction operations, and more to methods and systems for efficiently finding reduction operation values such as maximum or minimum values among multiple numerical inputs in high-speed digital processing applications.

As indicated above, traditional approaches to implementing reduction operations in digital hardware have relied primarily on binary tree comparison methods. However, while binary tree methods are mathematically efficient, their implementation in digital hardware presents challenges. The sequential nature of binary tree comparisons creates a critical timing path with a depth of log(n) logic levels. In high-speed digital circuits operating at frequencies exceeding 1 GHz, this sequential depth becomes a limiting factor for several reasons.

The critical timing path forces hardware synthesis tools to use larger, slower logic gates to meet the required timing constraints. These larger gates not only consume more area but also introduce additional propagation delays that further limit the maximum achievable clock frequency. Also, the sequential dependency between logic levels prevents parallel execution of comparisons, creating idle time in the hardware pipeline where computational resources are underutilized. Moreover, as the number of input values increases, the depth of the binary tree grows logarithmically, causing the timing bottleneck to worsen proportionally. This scaling limitation becomes problematic in applications that require processing larger numbers of values simultaneously, such as wide vector operations or matrix computations with high parallelism.

Alternative sequential comparison methods, where values are compared one after another in a linear fashion, avoid the complexity of tree structures but suffer from even worse timing characteristics, requiring n−1 sequential comparison operations and thus having a timing depth that grows linearly with the number of inputs.

The timing limitations of conventional reduction operation implementations have become increasingly problematic as digital systems demand higher clock frequencies and greater parallelism. In matrix multiplication engines used for artificial intelligence acceleration, for example, the normalization of floating-point results often requires finding the maximum among 8, 16, or more exponent values. The timing bottleneck created by conventional binary tree implementations can limit the overall throughput of these systems, reducing their effectiveness for computationally intensive applications.

The systems and methods described herein are designed for performing reduction operations in digital hardware that can achieve better timing characteristics while maintaining or improving area efficiency, for high-frequency applications such as floating-point arithmetic units and matrix multiplication engines.

At least some embodiments of the present invention provide a hardware architecture that redesign how reduction operations are implemented in digital circuits. Rather than relying on conventional sequential binary tree structures, these embodiments employ a parallel matrix comparison approach that simultaneously compares every input against every other input using a grid of comparator circuits. This parallel architecture achieves a breakthrough in computational technology by maintaining a constant timing depth regardless of the number of input values being processed, enabling digital hardware circuits to operate at higher clock frequencies while often using less overall circuit area.

The innovation of these embodiment may lie in transforming the inherently sequential nature of traditional reduction operations into a fully parallel hardware implementation. The embodiments utilize a plurality of comparator circuits arranged in a matrix configuration, where each comparator circuit performs a single comparison between two input signals. For each input signal, dedicated combinational logic circuits collect all comparison results where that signal was involved and generate a dominance signal indicating whether the input signal meets the reduction operation criteria (such as being the maximum value). This parallel processing approach eliminates the cascading delays that plague conventional binary tree implementations, resulting in a constant timing depth of only three logic levels regardless of whether the system processes 4, 8, 16, or more values simultaneously.

The embodiments represent a paradigm shift in digital hardware design philosophy by deliberately trading mathematical optimality for superior hardware performance characteristics. While the parallel matrix approach uses more individual comparison operations than the mathematically minimal binary tree method, this apparent inefficiency delivers substantial computational advantages. The constant timing depth enables hardware synthesis tools to use smaller, faster logic gates throughout the design, and the relaxed timing constraints often result in implementations that are both faster and smaller than conventional approaches. This counter-intuitive result demonstrates how hardware-optimized design can transcend purely mathematical optimization to achieve superior real-world performance.

The embodiments deliver transformative performance improvements across numerous high-performance computing applications. In matrix multiplication engines used for artificial intelligence and machine learning acceleration, embodiments of the invention may enable processing of larger matrix operations at higher throughput rates, directly improving the performance of neural network training and inference. Floating-point arithmetic units benefit from accelerated normalization processes, in applications requiring simultaneous processing of multiple floating-point operations such as vector processors and graphics processing units. The almost constant-depth scaling characteristic may make the invention valuable for scalable processor architectures where consistent performance across different parallelism levels is crucial.

The benefits of the invention may extend beyond raw performance improvements to enable new computational capabilities. The higher clock frequencies achievable with the constant timing depth allow digital systems to process more operations per unit time, increasing overall computational throughput. The area efficiency improvements, resulting from the ability to use smaller logic gates under relaxed timing constraints, enable integration of more processing units within the same silicon area, multiplying the parallelism benefits. Additionally, the predictable timing characteristics may simplify hardware design and verification processes, reducing development time and improving design reliability. For battery-powered devices, the combination of higher performance and improved area efficiency can lead to better energy efficiency, extending operational capabilities while reducing power consumption.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Figure 1:
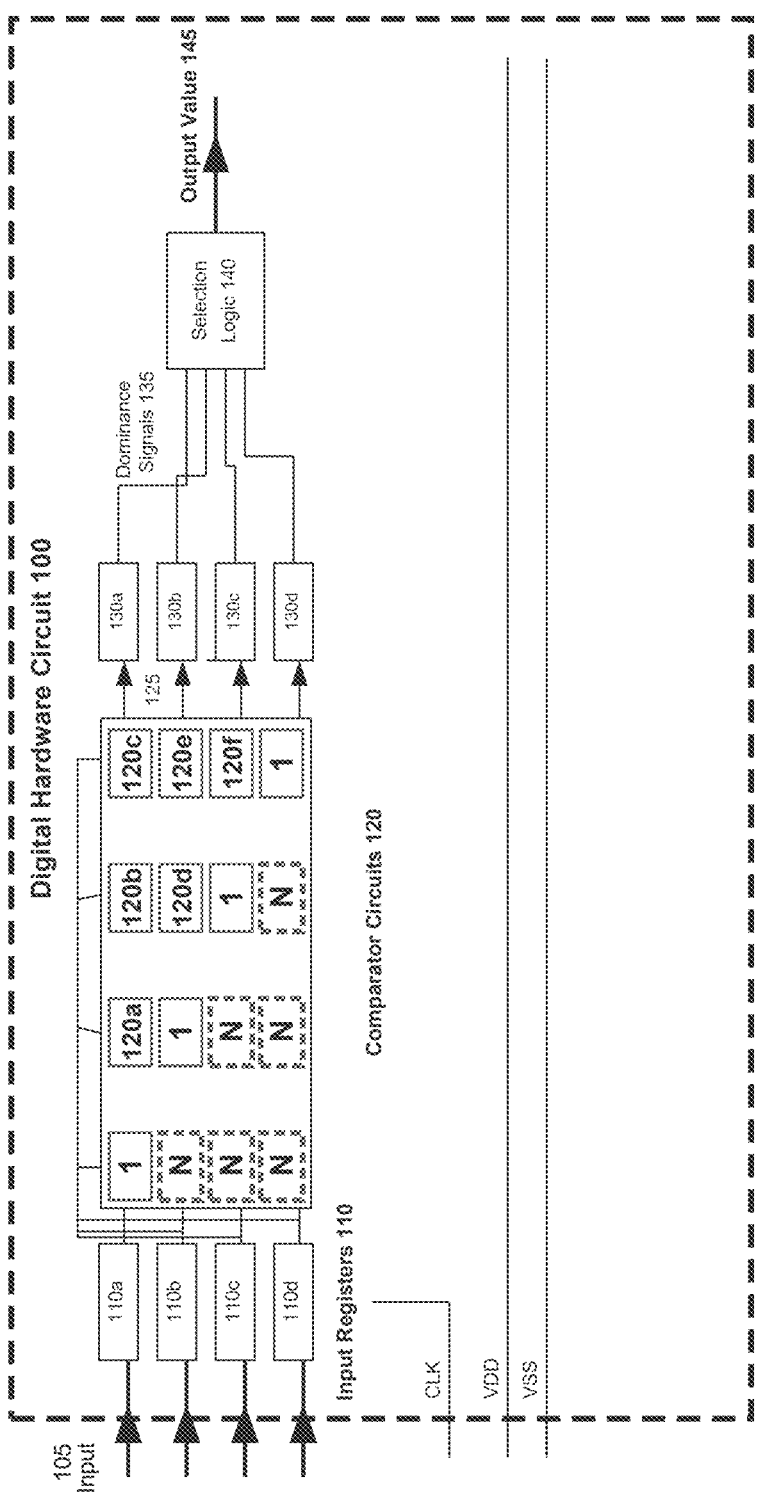

Referring to FIG. 1, which illustrates a digital hardware circuit 100 for finding a reduction operation value among a plurality of input signals, representing some embodiments of the present invention. The digital hardware circuit 100 comprises components arranged to achieve a constant timing depth operation while performing parallel comparison operations.

The digital hardware circuit 100 includes a plurality of input registers 110 configured to receive a plurality of input signals 105 representing numerical values. In this exemplary embodiment, four input registers 110a, 110b, 110c, and 110d are shown, each configured to receive and store a respective input signal representing a numerical value such as floating-point exponents, integer values, or other ordered digital data requiring reduction operation processing. The input registers 110 may be implemented using standard digital storage elements such as D-type flip-flops, latches, or register files, and are typically clocked by a system clock signal to provide synchronized data capture. In practical implementations, the input registers 110 may be configured to handle various data widths, such as 8-bit, 16-bit, 32-bit, or 64-bit values, depending on the specific application requirements. For example, in 32-bits IEEE-754 standard floating-point arithmetic applications, the input registers 110 might store 8-bit exponent values, while in general-purpose maximum-finding applications, they might store 32-bit integer values.

A plurality of comparator circuits 120 are arranged on the digital hardware circuit 100 in a matrix configuration, where each comparator circuit is configured to compare a respective one of the input signals against a respective other one of the input signals. In the four-input embodiment shown, comparator circuits 120a through 120f are arranged such that each input signal is compared against every other input signal. For instance, comparator circuit 120a compares the signal from input register 110a against the signal from input register 110b, comparator circuit 120b compares the signal from input register 110a against the signal from input register 110c, and so forth. Each comparator circuit 120 generates a comparison output 125a-d indicating whether the respective one of the input signals is greater than or equal to the respective other one of the input signals, for example an AND gate of all circuits in the respective row. The comparator circuits 120 may be implemented using standard digital comparison logic, such as magnitude comparators built from XOR gates, AND gates, and OR gates, or specialized comparison circuits optimized for specific data types such as IEEE 754 floating-point formats.

Optionally, as further depicted below, the actual number of comparator circuits 120 is reduced through two key optimizations that leverage the mathematical properties of the comparison matrix. First, diagonal where an input signal would be compared to itself ($c_{ii} \geq c_{ii}$) are eliminated as these always yield a true result and require no computation. Second, the antisymmetric properties of the comparison matrix are exploited, where $c_{ij} = \neg c_{ji}$, meaning that if input i is greater than input j, then input j is necessarily not greater than input i. This optimization reduces the hardware requirements from $n^2$ comparator circuits for n inputs to $n(n-1)/2$ comparator circuits while maintaining the same algorithmic structure and timing characteristics. The remaining circuit elements that replace the eliminated comparators are significantly simpler than the full comparator circuits 120 used in conventional approaches. For example, the diagonal elements are replaced with constant "1" circuits that provide a perpetual true signal, requiring minimal hardware resources. The antisymmetric elements are implemented using simple inversion circuits that compute the logical negation of their corresponding symmetric comparisons. These simplified circuits consume substantially less area and power than full magnitude comparators, while introducing negligible propagation delay. For example, in a 4-input implementation, this optimization reduces the requirement from 16 full comparator circuits to only 6 full comparators plus 6 simple inverters and 4 constant circuits, representing a significant hardware efficiency improvement without compromising the constant timing depth advantage.

The digital hardware circuit 100 further includes a plurality of combinatorial logic circuits 130, where each combinatorial logic circuit is associated with a respective input signal. Combinational logic circuits 130a, 130b, 130c, and 130d correspond to input signals from registers 110a, 110b, 110c, and 110d, respectively. Each combinatorial logic circuit 130 is configured to receive all comparison outputs 125a-d from comparator circuits 120 (either values or antisymmetric values as also demonstrated in FIG. 4) where the respective input signal was used as the first operand being compared, and generate a dominance signal 135 indicating whether the respective input signal is greater than or equal to all other input signals in the plurality of input signals. For example, combinatorial logic circuit 130a receives comparison outputs from comparator circuits 120a, 120b, and 120c (which compare input signal 110a against input signals 110b, 110c, and 110d, respectively) and generates dominance signal 135a. The combinatorial logic circuits 130 may be implemented as multi-input AND gates, where the dominance signal 135 is asserted only when all received comparison outputs indicate that the associated input signal is greater than or equal to all other input signals. For example, each comparator circuit receives values and/or antisymmetric values from a row in the matrix, for instance as depicted in FIG. 4. Dashed blocks in FIG. 1 depict negations (as the values are deduced from the asymmetry of the calculated values) and blocks with "1" represent constant true values which are used by the combinatorial logic circuits 130.

A selection logic 140 is configured to identify a dominance signal 135 that meets a reduction operation value condition and output a value 145 indicative of the input signal corresponding to the identified dominance signal. The selection logic 140 may include priority encoding circuitry, multiplexer arrangements, or other logic structures configured to process the dominance signals $135a$ through $135d$ and determine which input signal represents the result of the reduction operation. For maximum-finding operations, the selection logic 140 identifies which dominance signal 135 indicates a true state, signifying that the corresponding input signal is the maximum value. The output value 145 may be the actual maximum numerical value, an index indicating which input register contains the maximum value, or both, depending on the specific application requirements.

The digital hardware circuit 100 is configured to operate with an constant timing depth, specifically achieving a timing depth of three logic levels regardless of the number of input signals being processed. The first logic level comprises the comparator circuits 120, the second logic level comprises the combinatorial logic circuits 130, and the third logic level comprises the selection logic 140. This constant timing depth enables the digital hardware circuit 100 to operate at higher clock frequencies than conventional binary tree implementations, as the critical timing path does not increase with the number of input signals being processed.

The digital hardware circuit 100 may be part of a matrix multiplication engine and used for performing matrix multiplication operations as also exemplified below.

While the parallel matrix comparison architecture achieves an constant timing depth of three logic levels, the specific implementation of the combinatorial logic circuits 130 may affect the precise timing characteristics. In an exemplary implementations utilizing wired-AND logic for example, each combinatorial logic circuit 130 may perform the AND operation of all comparison outputs 125 for a given row in a single logic level, maintaining the true constant timing depth of exactly three levels.

For clarity, throughout this specification, the term "constant timing depth" is used and also covers the case when standard cell libraries are used and employ AND gate structures that require from the combinatorial logic circuits 130 $\log_2(n)$ additional logic levels to combine all comparison outputs for each input signal. Even in such implementations, the overall timing depth remains substantially superior to conventional binary tree approaches, as the additional $\log(n)$ levels apply only to the second logic level rather than the entire critical path.

Figure 2:
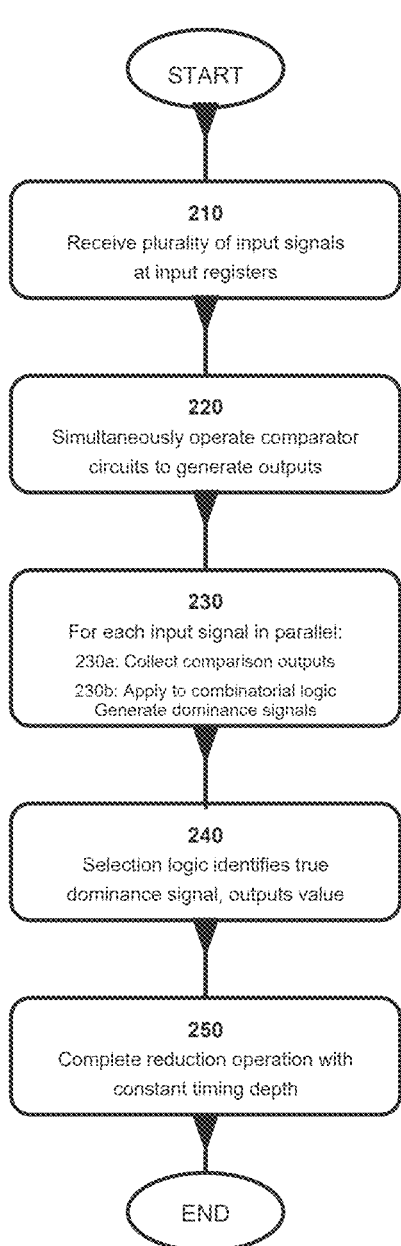
FIG. 2 is a flowchart illustrating a method of operating the digital hardware circuit of FIG. 1 to perform reduction operations using parallel matrix comparison, showing the three-level constant timing depth process from input signal reception through final result output, according to some embodiments of the present invention.

Reference is now also made to FIG. 2 which illustrates a flowchart 200 depicting the method of operating the digital hardware circuit 100 described in FIG. 1 to find a reduction operation value among a plurality of input signals according to some embodiments of the present invention. The flowchart demonstrates the parallel processing methodology that enables a constant timing depth operation while performing reduction operations.

The method begins at step 210 with receiving the plurality of input signals 105 representing numerical values at the input registers 110 of the digital hardware circuit 100. This step involves capturing and storing the input data that will be processed by the reduction operation. For example, in a floating-point normalization application, step 210 might involve receiving four 8-bit exponent values at input registers $110a$ through $110d$, where each exponent represents a component of a floating-point arithmetic operation requiring normalization. The input signals 105 are synchronized with a system clock to ensure stable data capture across all input registers 110 simultaneously.

At step 220, the method simultaneously operates the plurality of comparator circuits 120 arranged on the digital hardware circuit 100. This step represents the first logic level of the constant timing depth operation. Each comparator circuit 120 compares a respective one of the input signals against a respective other one of the input signals and generates a comparison output $125a\text{-}d$ indicating whether the first input signal is greater than or equal to the second input signal. For instance, in the four-input embodiment, comparator circuit $120a$ simultaneously compares the signal from input register $110a$ against the signal from input register $110b$, while comparator circuit $120b$ compares the signal from input register $110a$ against the signal from input register $110c$, and so forth. This simultaneous operation of all comparator circuits 120 eliminates the sequential delays inherent in conventional binary tree approaches.

The method proceeds to step 230, which performs parallel processing operations for each input signal in the plurality of input signals. This step comprises two sub-operations that execute concurrently for all input signals, representing the second logic level of the constant timing depth operation. At sub-step $230a$, the method collects all comparison outputs $125a\text{-}d$ from comparator circuits 120 where each respective input signal was used as the first operand being compared. For example, for the input signal from register $110a$, sub-step $230a$ collects comparison outputs from comparator circuits $120a$, $120b$, and $120c$, which represent the results of comparing the input signal from register $110a$ against the input signals from registers $110b$, $110c$, and $110d$, respectively.

Concurrently with sub-step $230a$, at sub-step $230b$, the method applies the collected comparison outputs $125a\text{-}d$ to the respective combinatorial logic circuit 130 to generate a dominance signal 135 indicating whether the input signal is greater than or equal to all other input signals in the plurality of input signals. For instance, combinatorial logic circuit $130a$ receives the comparison outputs collected in sub-step $230a$ and generates dominance signal $135a$, which indicates whether the input signal from register $110a$ represents the maximum value among all input signals. The combinatorial logic circuits 130 typically implement multi-input AND gate functionality, where the dominance signal 135 is asserted only when all received comparison outputs $125a\text{-}d$ indicate that the associated input signal is greater than or equal to all other input signals.

At step 240, representing the third and final logic level of the constant timing depth operation, the method outputs a value 145 indicative of an input signal corresponding to a dominance signal 135 that meets a reduction operation value condition. The selection logic 140 processes the dominance signals $135a$ through $135d$ generated in step 230 and identifies which dominance signal indicates that its corresponding input signal satisfies the reduction operation criteria. For a maximum-finding operation, step 240 identifies which dominance signal 135 indicates a true state, signifying that the corresponding input signal represents the maximum value among all inputs. The output value 145 may comprise the actual numerical value of the maximum input signal, an index indicating which input register 110 contains the maximum (or minimum) value, or both values depending on the application requirements.

The method proceeds to step 250, where the digital hardware circuit 100 completes the reduction operation with a constant timing depth. The entire process from step 210 through step 240 executes within exactly three logic levels, regardless of the number of input signals being processed. This constant timing depth characteristic enables the digital hardware circuit 100 to maintain consistent performance and timing behavior whether processing 4, 8, 10, or more input values, providing advantages over conventional binary tree implementations whose timing depth increases logarithmically with the number of inputs.

The methodology of embodiments of the present invention may be expressed through a pseudocode implementation that demonstrates the parallel matrix comparison approach and its advantages over conventional sequential and binary tree methods (when used with the described hardware). This pseudocode representation provided herein provides a clear algorithmic description of how the digital hardware circuit 100 and the corresponding method operate to achieve a constant timing depth while performing reduction operations. This pseudocode represents implementation of the method in FIG. 2 when used for computing a maximum of n integers, though the same algorithmic structure applies to other reduction operations such as minimum finding by appropriate modification of the comparison operations:

Require: m, $v=\{v_i\}\_\{i=1\}^n$ such that $\forall$, $v_i \in N$

Ensure: $y=\max\_\{i=1\}^n v_i$

1: for $i=1 \ldots, n$ do

2: for $j=1, \ldots, n$ do

3: $c_{ij} \leftarrow v_i \geq v_j$

4: end for

5: $o_i \leftarrow \forall\_\{j=1\}n \ ^c_{ij}$

6: end for

7: $\max \leftarrow V\_\{i=1\}^n o_i \forall v_i$

8: Return(max)

This pseudocode directly corresponds to the hardware implementation described in the digital hardware circuit 100, with each algorithmic step mapping to specific hardware components and operations. Lines 1-4 represent the parallel comparison matrix operation performed by the plurality of comparator circuits 120, where every input signal $v_i$ is compared against every other input signal $v_j$ to generate comparison outputs $c_{ij}$. The nested loop structure indicates that all comparisons are performed simultaneously in hardware, corresponding to the parallel arrangement of comparator circuits 120 in the matrix configuration.

Line 5 represents the combinatorial logic operation performed by the combinatorial logic circuits 130, where each circuit computes the logical AND ($\wedge$) of all comparison outputs $c_{ij}$ for a given input signal $v_i$. The dominance signal $o_i$ corresponds to the dominance signals 135 generated by the combinatorial logic circuits 130, indicating whether input signal $v_i$ is greater than or equal to all other input signals. The simultaneous execution of this step for all input signals oi corresponds to the parallel operation of all combinational logic circuits 130a through 130d.

Line 7 represents the selection logic operation performed by the selection logic 140, where the final maximum value is determined by identifying which dominance signal oi indicates a true state and selecting the corresponding input value $v_i$. The logical OR (V) operation combined with the AND operations identifies the unique input signal that satisfies the maximum condition, corresponding to the output value 145 generated by the selection logic 140.

The algorithmic structure demonstrates why the parallel matrix approach achieves a constant timing depth. Lines 1-4 execute in parallel during the first logic level, with all $n^2$ comparison operations completing simultaneously regardless of the value of n. Line 5 executes in parallel during the second logic level, with all n dominance calculations completing simultaneously. Line 7 executes during the third logic level, performing the final selection operation. This three-level structure remains constant (or almost constant as detailed above) regardless of the number of input signals n, providing the fundamental timing advantage over conventional approaches.

The actual number of required comparisons may be reduced to (n choose 2) by eliminating diagonal comparisons (cii=True) and leveraging antisymmetric properties (cij=cji). This optimization reduces the hardware requirements from $n^2$ comparator circuits to n(n−1)/2 comparator circuits while maintaining the same algorithmic structure and timing characteristics.

The pseudocode also illustrates the scalability advantages of the parallel matrix approach compared to conventional methods. While sequential approaches require n−1 sequential operations with timing depth proportional to n, and binary tree approaches require $\log_2(n)$ sequential levels, the above maintains constant timing depth regardless of n. This algorithmic advantage translates directly to the hardware performance benefits achieved by the digital hardware circuit 100.

For further clarifying the difference from the binary tree approach, referring now to FIG. 3, there is shown a traditional binary tree comparison method 5 of the prior art for determining a maximum value among four input signals. Input signals $a1_1$, a2, . . . −a16 are provided, for example to first-level comparator circuits. A first comparator circuit receives input signals and determines the maximum value between them. Similarly, a second comparator circuit receives input signals and determines the maximum value between them.

The outputs from first-level comparator circuits are then provided to a second-level comparator circuit, which determines the overall maximum value. This is repeated for example into a third-level comparator circuit. The final result is provided as output, for example a maximum or a minimum value.

This prior art approach suffers from a fundamental limitation: the timing depth scales logarithmically with the number of input signals. For four input signals, two sequential logic levels are required ($\log_2(4)=2$). For sixteen input signals, four sequential logic levels would be required ($\log_2(16)=4$). This sequential processing creates a critical timing bottleneck that forces hardware synthesis tools to use larger, slower gates to meet timing requirements, ultimately limiting achievable clock frequencies and overall system performance.

Turning now to FIG. 4, there is illustrated the parallel matrix comparison method of the present invention (in this example with a maximum-value reduction operation). Input signals $a_1$, $a_2$, $a_3$, and $a_4$ are simultaneously provided to a plurality of comparator circuits arranged in a matrix configuration.

In the comparison matrix, each input signal is compared against every other input signal in parallel. Individual comparison results and so forth are generated simultaneously by dedicated comparator circuits. For n input signals, $n^2$ comparison operations are performed in parallel, contrasting sharply with the sequential approach of the prior art. The comparison matrix is antisymmetric, therefore the comparisons on the diagonal are trivial and not computed as further described herein. The lower triangle can be efficiently computed as the negation of the upper triangle.

The comparison outputs from each row of the matrix are then provided to corresponding combinational logic circuits, for example multi-input AND gate circuits which in this example are set to find a maximum value. In this example, each AND gate receives all comparison results for its associated input signal. For example, AND gate receives comparison results which indicate whether the respective input signal is greater than or equal to all other input signals.

The dominance signals from AND gates may be provided to a selection logic, which identifies which dominance signal indicates a maximum value condition and generates the appropriate output.

Crucially, this entire process completes within a constant timing depth of three logic levels: (1) the parallel comparison operations, (2) the AND gate operations, and (3) the final selection operation. This constant timing depth is independent of the number of input signals, representing a fundamental advancement over the logarithmic scaling of prior art methods.

Optionally, the constant timing depth described above comprises exactly three logic levels: (1) parallel comparator circuits 120 performing all pairwise comparisons simultaneously, (2) combinational logic circuits 130 generating dominance signals 135 through multi-input AND operations, and (3) selection logic 140 identifying the final result. This three-level structure remains constant (or almost constant as described above) regardless of input count, enabling higher clock frequencies than conventional binary tree implementations that require $\log_2(N)$ sequential levels.

Optionally, the digital hardware circuit 100 comprises at least one of an application-specific integrated circuit (ASIC) and a field-programmable gate array (FPGA). In ASIC implementations, the invention benefits from custom-designed magnitude comparators optimized for specific data formats, custom AND gate arrays with optimized transistor sizing, and specialized priority encoders designed for expected input patterns. The constant timing depth enables aggressive design optimizations during synthesis and place-and-route phases.

In FPGA implementations, the invention leverages reconfigurable logic fabric and dedicated arithmetic resources. Comparator circuits 120 can be implemented using FPGA look-up tables (LUTs) or dedicated DSP blocks, while combinational logic circuits 130 benefit from carry chain logic for efficient wide AND gate implementation. The reconfigurable nature enables easy adaptation for different input widths or reduction operation types without requiring new silicon fabrication.

Both implementations benefit from the scalable, regular structure of the parallel matrix approach, which facilitates automated implementation using standard design tools and ensures predictable timing closure across different platforms.

Optionally, the reduction operation performed by the digital hardware circuit 100 and the corresponding method may be maximum-value reduction operations, minimum-value reduction operations, maximum-index reduction operations, and/or minimum-index reduction operations.

For maximum-value reduction operations, the digital hardware circuit 100 operates as previously described, where each comparator circuit 120 generates comparison outputs 125 indicating whether the first input signal is greater than or equal to the second input signal. The combinatorial logic circuits 130 implement AND gate functionality to generate dominance signals 135 that identify which input signal is greater than or equal to all others. The selection logic 140 then outputs the maximum numerical value or its corresponding index. This configuration is valuable in floating-point arithmetic normalization, where the maximum exponent among multiple operands must be identified to align mantissa values correctly.

For minimum-value reduction operations, the digital hardware circuit 100 employs a complementary approach where each comparator circuit 120 generates comparison outputs 125a-d indicating whether the first input signal is less than or equal to the second input signal. The combinatorial logic circuits 130 continue to implement AND gate functionality, but now generate dominance signals 135 that identify which input signal is less than or equal to all others, effectively identifying the minimum value. This operation is useful in applications such as finding the smallest error value in error correction systems or identifying the minimum delay path in timing analysis applications.

In summation reduction operations, the digital hardware circuit 100 adapts the parallel comparison approach to efficiently compute the sum of all input signals. The comparator circuits 120 are reconfigured to perform partial sum calculations, where each comparator circuit computes the sum of its two input operands rather than comparing them. The combinatorial logic circuits 130 are modified to implement adder trees that combine the partial sums from the first level, maintaining the three-level timing depth. This configuration enables high-speed accumulation operations essential in matrix multiplication and digital signal processing applications.

Maximum-index and minimum-index reduction operations represent variations where the selection logic 140 outputs an index value indicating the position of the maximum or minimum input signal rather than the actual numerical value itself. In these configurations, the comparator circuits 120 and combinational logic circuits 130 operate identically to maximum-value or minimum-value operations, respectively, but the selection logic 140 includes index encoding circuitry that generates a binary-encoded output indicating which input register 110 contains the target value. For example, in a 16-input system, the selection logic 140 would output a 4-bit index value ranging from 0 to 15. These index-based operations are useful in applications such as winner-take-all neural networks, where the position of the maximum activation value is more important than the actual magnitude.

A single digital hardware circuit 100 may be configured at design time or potentially reconfigured at runtime to perform different reduction operations as needed by the application. This flexibility may be used for reconfigurable computing environments and multi-function processing units where different algorithms may require different types of reduction operations. The constant timing depth characteristic is maintained across all reduction operation types, ensuring predictable performance regardless of the specific operation being performed.

Optionally, the method may be implemented as part of a hierarchical system using multiple first-level digital hardware circuits 100 to process groups of input signals, followed by a second-level circuit 150 to process the group results. This approach enables scaling to large input counts (e.g., 32+ inputs) while maintaining a constant timing depth. The total timing depth becomes 6 levels (e.g.,3 for group processing+3 for final processing) regardless of total input count, providing advantages over binary tree approaches for large-scale implementations.

Optionally, the constant timing depth enables higher clock frequencies than conventional binary tree or sequential comparison methods. While binary tree approaches require $\log_2(N)$ sequential levels that increase with input count, the parallel matrix approach maintains 3 levels regardless of N.

Optionally, the plurality of comparator circuits 120 are arranged in a grid pattern on the digital hardware circuit 100, providing optimal physical layout characteristics. In this arrangement, comparator circuits are positioned in a two-dimensional matrix structure where each row and column corresponds to one of the input signals being processed. For an N-input implementation, the grid forms an N×N array, with diagonal positions typically omitted as unnecessary.

The grid pattern provides several implementation advantages: efficient silicon area utilization through uniform spacing, simplified routing channels that minimize total wire length, and reduced parasitic capacitance and resistance that improve signal integrity. The regular geometric structure facilitates automated place-and-route tools and enables efficient power distribution. This arrangement scales efficiently to larger implementations and aligns naturally with both FPGA fabric structures and ASIC tiled layout approaches.

Optionally, the plurality of comparator circuits 120 are optimized by eliminating diagonal comparisons where an input signal would be compared to itself and by using antisymmetric properties to reduce the number of required comparison circuits for example as shown at FIG. 1. Combining both optimizations, the total number of required comparator circuits for an N-input implementation is reduced from $N^2$ to $N(N-1)/2$. For example, a 4-input implementation requires only 6 comparator circuits instead of 16 as depicted in FIG. 1, while a 16-input implementation requires 120 comparator circuits instead of 256.

Optionally, the combinatorial logic circuit 130 comprises a multi-input AND gate circuit that generates dominance signals 135 indicating whether each input signal is greater than or equal to all other input signals. The AND gate operates on the principle that a dominance signal should be asserted only when all comparison outputs associated with a particular input signal indicate favorable comparisons.

For maximum-finding operations, the AND gate combines comparison outputs where the associated input signal was determined to be greater than or equal to all other signals, producing a true output only when all input conditions are simultaneously satisfied. This implementation provides scalability, efficient mapping to both ASIC and FPGA technologies, and inherent fault tolerance characteristics. The approach works equally well for minimum-finding operations by simply configuring comparator circuits to generate "less than or equal to" relationships.

Optionally, outputting the value 145 comprises identifying which dominance signal 135 indicates a true state. In properly functioning reduction operations, exactly one dominance signal should indicate true while all others indicate false. The selection logic 140 examines all dominance signals to determine which is asserted, typically using priority encoder circuits that generate binary-encoded outputs indicating the position of the true input, or multiplexer arrangements that route corresponding input signal values to the output.

Optionally, the method is implemented in high-performance computing applications including matrix multiplication engines, floating-point arithmetic units, and artificial intelligence accelerators. In matrix multiplication engines used for AI and machine learning, the invention enables processing larger operations at higher throughput rates, directly improving neural network training and inference performance. The constant timing depth characteristic ensures consistent performance across different matrix sizes and network architectures.

For floating-point arithmetic normalization, the invention provides critical performance enhancements by efficiently identifying maximum exponents among multiple operands during accumulation phases. In AI accelerators, the integration enables specialized computational capabilities optimized for massive parallel processing requirements, supporting both neural network training applications that require millions of matrix operations per iteration and real-time inference applications with strict latency requirements.

The scalability advantages support increasing computational demands of modern neural networks, while the high-frequency operation capability (exceeding 1 GHZ) enables teraFLOPS performance levels essential for contemporary AI workloads.

Optionally, the digital hardware circuit 100 is fabricated with comparator circuits 120 positioned to minimize physical routing distances between connected components. This optimization focuses on placing circuits that share common input signals or contribute to the same combinatorial logic circuit in close physical proximity, reducing overall wire length while maintaining logical connectivity requirements.

The routing distance minimization provides critical performance advantages: reduced parasitic capacitance and resistance improve signal propagation speed and reduce power consumption, shorter signal paths exhibit better signal integrity with reduced crosstalk and electromagnetic interference, and faster signal transitions enable operation at higher clock frequencies. These benefits are particularly important at frequencies exceeding 1 GHz where parasitic effects significantly impact timing performance.

Optionally, the method trades increased hardware area for reduced timing depth to optimize overall performance in matrix processing applications. While requiring approximately $(N^2-N)/2$ comparators versus $N-1$ in binary tree approaches, this apparent inefficiency delivers substantial timing advantages. The constant 3-level depth versus $\log_2(N)$ levels enables exponentially better clock frequencies that more than compensate for increased area, valuable in AI acceleration where computational throughput determines performance.

Optionally, the method of operating the digital hardware circuit 100 is integrated into a floating-point arithmetic unit as a bottleneck optimization, providing targeted performance enhancements for the most timing-critical component of floating-point processing pipelines. This integration approach recognizes that reduction operations, maximum and minimum finding for exponent comparison and normalization, represent performance bottlenecks in conventional floating-point arithmetic units and addresses these bottlenecks through the constant timing depth advantages of the parallel matrix approach.

Floating-point arithmetic units (FPUs) are fundamental components in modern processors that perform mathematical operations on numbers represented in IEEE 754 floating-point format. These units typically implement addition, subtraction, multiplication, division, and various specialized functions such as square root and transcendental operations. Within FPU implementations, several critical operations require reduction functionality, most notably the normalization processes that align operands and results to appropriate exponent values, and exception handling procedures that must identify maximum or minimum values among multiple intermediate results.

The integration of the digital hardware circuit 100 into a floating-point arithmetic unit may target the normalization bottleneck that occurs during floating-point addition and subtraction operations involving multiple operands. When adding or subtracting floating-point numbers with different exponents, the FPU must identify the maximum exponent among all operands and shift the mantissa values of the smaller-exponent operands to align them with this maximum exponent before performing the arithmetic operation. In conventional FPU designs, this maximum exponent identification step often represents the critical timing path that limits the overall FPU clock frequency and throughput.

Optionally, the digital hardware circuit 100 operates at clock frequencies exceeding 1 GHZ due to the constant timing depth. At these frequencies, each of the three logic levels must complete within approximately 150-170 picoseconds (at 2 GHz operation), which the parallel matrix architecture enables through predictable, minimal timing paths. This high-frequency capability enables teraFLOPS performance levels for AI accelerators and matrix multiplication engines while maintaining reliable operation under stringent timing constraints.

Optionally, the matrix multiplication processing engine incorporating the digital hardware circuit 100 is part of an artificial intelligence accelerator, providing specialized computational capabilities optimized for the massive parallel processing requirements of modern machine learning and neural network applications. This AI accelerator integration represents one of the most commercial applications of the invention, where the constant timing depth advantages directly enable the high-throughput, low-latency computation essential for both neural network training and real-time inference applications.

The integration into AI accelerators provides substantial performance benefits for neural network training applications, where massive numbers of matrix multiplications must be performed to compute forward propagation, backpropagation, and weight update operations. During training of large neural networks such as transformer models used for natural language processing or convolutional networks used for computer vision, millions of matrix operations are performed per training iteration. Each matrix operation potentially requires multiple reduction operations for normalization and numerical stability, making the timing performance of these reductions critical to overall training throughput. The constant timing depth of the digital hardware circuit 100 enables these reduction operations to complete efficiently regardless of matrix size, allowing the AI accelerator to maintain consistent high performance across different network architectures and training configurations.

Reference is now also made to FIG. 5 which illustrates a flowchart 300 depicting the hierarchical method of operating a digital hardware circuit, demonstrating how the parallel matrix comparison methodology may be extended to efficiently process significantly larger numbers of input signals while maintaining the constant timing depth advantages. This hierarchical flowchart represents an advanced implementation approach that leverages multiple instances of the basic parallel comparison process described in FIG. 2 to achieve scalable performance for large-scale reduction operations.

The hierarchical method begins at step 310 with receiving a plurality of input signals representing numerical values at input registers of the digital hardware circuit. In this hierarchical embodiment, the total number of input signals may be substantially larger than what can be efficiently processed by a single-level implementation, such as 32, 64, or more input signals that require reduction operation processing. The input signals are captured and stored across multiple sets of input registers, such as input register sets 110a, 110b, 110c, and 110d, each configured to handle a subset of the total input signals.

At step 320, the method organizes the plurality of input signals into multiple groups, with each group containing a manageable number of input signals that can be processed efficiently by a single parallel comparison matrix. For example, 16 total input signals might be organized into four groups of 4 signals each, where group A contains input signals 1-4, group B contains input signals 5-8, group C contains input signals 9-12, and group D contains input signals 13-16. This grouping strategy enables the hierarchical approach to leverage multiple parallel processing units while maintaining optimal performance characteristics for each individual group.

The method proceeds to step 330, which implements the core parallel comparison process for each group simultaneously. This step comprises several sub-operations that execute in parallel across all groups. At sub-step 330a, each group simultaneously operates its dedicated plurality of comparator circuits arranged in the matrix configuration described in previous embodiments. For example, group A operates comparator circuits 120a_1 through 120a_4 (using the optimized count of 4×3/2=6 comparators for 4 inputs), while group B operates its own set of comparator circuits 120b_5 through 120b_8, and so forth. Each comparator circuit compares a respective one of the input signals in its group against a respective other one of the input signals in the same group, generating comparison outputs that indicate the relative ordering within that group.

Concurrently with sub-step 330a, at sub-step 330b, each group applies the comparison outputs to its dedicated combinational logic circuits to generate dominance signals for each input signal within that group. Group A employs combinational logic circuits 130a_1 through 130a_4 to process the comparison outputs from its comparator circuits and generate dominance signals 135a_1 through 135a_4, while the other groups operate their corresponding combinational logic circuits in parallel. This parallel processing across groups enables simultaneous determination of the local maximum (or other reduction result) within each group.

At sub-step 330c, each group outputs a group result based on its dominance signals, where each group result represents the reduction operation result for that particular group of input signals. For maximum-finding operations, each group result indicates the maximum value found within that specific group. These group results, designated as group_result_A, group_result_B, group_result_C, and group_result_D, serve as intermediate values that will be processed in the subsequent hierarchical level.

The method continues to step 340, which determines the final result by applying the same parallel comparison process to the group results generated in step 330. This second-level parallel comparison process operates identically to the methodology described in FIG. 2, but uses the group results as input signals rather than the original input values. A second-level digital hardware circuit 150 receives the group results at its input registers 151, operates its comparator circuits 152 to compare group results against each other, applies its combinatorial logic circuits 153 to generate second-level dominance signals, and employs its selection logic 154 to identify the final reduction operation result.

At step 350, the method outputs the final result value 345, which represents the reduction operation result for the entire set of input signals across all groups. For maximum-finding operations, this final result indicates the maximum value among all original input signals, having been determined through the two-level hierarchical process. The output value 345 may include both the actual maximum numerical value and an identification of which original input signal (and which group) contained this maximum value.

The method concludes at step 360, where the hierarchical digital hardware circuit completes the reduction operation with a constant timing depth. The entire hierarchical process executes within exactly six logic levels regardless of the total number of input signals being processed: three levels for the first-level group processing (step 330) plus three levels for the second-level group result processing (step 340). This six-level timing depth remains constant whether the system processes 16 inputs using four 4-input groups, 64 inputs using three levels: 4 16-input groups, each one is implemented as four 4-input; or even larger input counts using additional groups.

The hierarchical flow chart demonstrates several key advantages over conventional scaling approaches, though it is important to clarify the nature of the timing depth comparison. While the hierarchical approach requires six logic levels compared to $\log_2(N)$ levels for binary tree approaches, the complexity and delay characteristics of these levels differ significantly. In the hierarchical implementation, the first level consists of parallel comparison matrices with uniform, predictable delay characteristics, whereas the subsequent two levels involve much simpler combinatorial logic operations with substantially lower complexity and faster propagation delays. The binary tree approach, conversely, requires each of its $\log_2(N)$ levels to have similar complexity throughout the tree structure.

Second, the resource utilization characteristics of the hierarchical approach scale more efficiently than single-level implementations. Rather than requiring a single massive comparison matrix with $N^2$ comparator circuits for N inputs, the hierarchical approach distributes the comparison load across multiple smaller matrices, reducing the total hardware requirements while maintaining superior timing performance.

The hierarchical methodology shown in FIG. 5 maintains full compatibility with all optional features described in the above embodiments, including different reduction operation types, ASIC and FPGA implementations, optimization techniques, and high-frequency operation capabilities.

The invention also encompasses additional embodiments that correspond to the optimized comparator circuit implementation and hierarchical reduction operation implementation described above in different contexts and applications.

It is expected that during the life of a patent maturing from this application many relevant systems and units will be developed and the scope of the term circuit, comparator output and input is intended to include all such new technologies a priori.

As used herein the term "about" refers to ±10%.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

It is the intent of the Applicant(s) that all publications, patents and patent applications referred to in this specification are to be incorporated in their entirety by reference into the specification, as if each individual publication, patent or patent application was specifically and individually noted when referenced that it is to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

What is claimed is:

1. A method of operating a digital hardware circuit to find a reduction operation value among a plurality of input signals, the method comprising:

receiving the plurality of input signals representing numerical values at input registers of the digital hardware circuit;

simultaneously operating a plurality of comparator circuits arranged on the digital hardware circuit, wherein each comparator circuit compares a respective one of the input signals against a respective other one of the input signals and generates a comparison output indicating whether the respective one of the input signals is greater than or equal to the respective other one of the input signals;

for each input signal in the plurality of input signals, performing the following operations in parallel:

collecting all comparison outputs from comparator circuits where the input signal was used as the respective one of the input signals being compared, applying the collected comparison outputs to a combinatorial logic circuit to generate a dominance signal indicating whether the input signal is greater than or equal to all other input signals in the plurality of input signals; and outputting a value indicative of an input signal corresponding to a dominance signal from dominance signals generated in the previous step that meets a reduction operation value condition;

wherein the digital hardware circuit operates with a constant timing depth.

2. The method of claim 1, wherein the constant timing depth comprises exactly three logic levels.

3. The method of claim 1, wherein the digital hardware circuit comprises at least one of an application-specific integrated circuit (ASIC) and a field-programmable gate array (FPGA).

4. The method of claim 1, wherein the reduction operation is selected from a group consisting of:

a maximum-value reduction operation, a minimum-value reduction operation, a maximum-index reduction operation and a minimum-index reduction operation.

5. The method of claim 1, wherein the method is implemented as part of a hierarchical reduction operation-finding operation that:

performs multiple parallel reduction operation-finding operations on groups of input signals; and performs a final reduction operation-finding operation on the resulting reduction operation values.

6. The method of claim 1, wherein the constant timing depth enables higher clock frequencies than achievable with binary tree comparison methods or sequential comparison methods.

7. The method of claim 1, wherein the plurality of comparator circuits are arranged in a grid pattern on the digital hardware circuit.

8. The method of claim 1, wherein the plurality of comparator circuits are optimized by:

eliminating diagonal comparisons where an input signal would be compared to itself; and using antisymmetric properties to reduce the number of required comparison circuits.

9. The method of claim 1, wherein the combinatorial logic circuit comprises a multi-input AND gate circuit.

10. The method of claim 1, wherein outputting which dominance signal indicates the reduction operation value condition comprises identifying which dominance signal indicates a true state.

11. The method of claim 1, wherein the method is performed for floating-point arithmetic normalization in matrix multiplication operations.

12. The method of claim 1, wherein the method trades increased hardware area for reduced timing depth to optimize overall digital hardware circuit performance for high-frequency operation in matrix processing applications.

13. The method of claim 1, wherein the digital hardware circuit is fabricated with the comparator circuits positioned to minimize physical routing distances between connected components.

14. The method of claim 1, wherein the method trades increased hardware area for reduced timing depth to optimize overall digital hardware circuit performance, wherein the trade-off enables higher-frequency operation in matrix processing applications.

15. The method of claim 1, wherein the method is integrated into a floating-point arithmetic unit as a bottleneck optimization.

16. The method of claim 1, wherein the digital hardware circuit operates at clock frequencies exceeding 1 GHz due to the constant timing depth.

17. A digital hardware circuit for finding a reduction operation value among a plurality of input signals, comprising:

input registers configured to receive the plurality of input signals representing numerical values;

a plurality of comparator circuits arranged on the digital hardware circuit, wherein each comparator circuit is configured to compare a respective one of the input signals against a respective other one of the input signals and generate a comparison output indicating whether the respective one of the input signals is greater than or equal to the respective other one of the input signals;

a plurality of combinational logic circuits, wherein each combinatorial logic circuit is associated with a respective input signal and configured to:

receive all comparison outputs from comparator circuits where the respective input signal was used as the respective one of the input signals being compared, and generate a dominance signal indicating whether the respective input signal is greater than or equal to all other input signals in the plurality of input signals;

a selection logic configured to identify a dominance signal that meets a reduction operation value condition and output a value indicative of the input signal corresponding to the identified dominance signal;

wherein the digital hardware circuit is configured to operate with a constant timing depth.

18. A method of operating a digital hardware circuit comprising:

receiving a plurality of input signals representing numerical values at input registers of the digital hardware circuit;

organizing the plurality of input signals into multiple groups;

for each group, applying a parallel comparison process that: simultaneously operates a plurality of comparator circuits arranged on the digital hardware circuit, wherein each comparator circuit compares a respective one of the input signals in the group against a respective other one of the input signals in the group and generates a comparison output, for each input signal in the group, applies the comparison outputs to a combinatorial logic circuit to generate a dominance signal, outputs a group result based on the dominance signals;

determining a final result by applying the same parallel comparison process to the group results;

wherein the digital hardware circuit operates with a constant timing depth.

* * * * *